United States Patent
Gao et al.

(10) Patent No.: US 11,384,451 B2
(45) Date of Patent: Jul. 12, 2022

(54) CRUCIBLE FOR CRYSTAL GROWTH AS WELL AS METHOD FOR RELEASING THERMAL STRESS IN SILICON CARBIDE CRYSTAL

(71) Applicant: Anhui Weixin Changjiang Semiconductor Material Co., Ltd., Tongling (CN)

(72) Inventors: Pan Gao, Shanghai (CN); Jun Xin, Shanghai (CN); Haikuan Kong, Shanghai (CN); Xuechao Liu, Shanghai (CN); Yanqing Zheng, Shanghai (CN); Erwei Shi, Shanghai (CN)

(73) Assignee: ANHUI WEIXIN CHANGJIANG SEMICONDUCTOR MATERIAL CO., LTD., Tongling (CN)

( * ) Notice: Subject to any disclaimer, the term of this patent is extended or adjusted under 35 U.S.C. 154(b) by 29 days.

(21) Appl. No.: 16/962,712

(22) PCT Filed: Jan. 9, 2019

(86) PCT No.: PCT/CN2019/071008
§ 371 (c)(1),
(2) Date: Jul. 16, 2020

(87) PCT Pub. No.: WO2019/144804
PCT Pub. Date: Aug. 1, 2019

(65) Prior Publication Data
US 2020/0354856 A1    Nov. 12, 2020

(30) Foreign Application Priority Data
Jan. 24, 2018 (CN) .......................... 201810069412.9

(51) Int. Cl.
*C30B 29/36* (2006.01)
*C30B 35/00* (2006.01)

(52) U.S. Cl.
CPC ............ *C30B 35/002* (2013.01); *C30B 29/36* (2013.01)

(58) Field of Classification Search
CPC ........ C30B 23/00; C30B 29/36; C30B 35/002
See application file for complete search history.

(56) References Cited

U.S. PATENT DOCUMENTS

| 6,334,898 | B1 * | 1/2002 | Bommier | ................ C30B 15/10 |
| | | | | 117/200 |
| 2009/0169459 | A1 * | 7/2009 | Zwieback | ......... H01L 21/02576 |
| | | | | 423/346 |

(Continued)

FOREIGN PATENT DOCUMENTS

| CN | 201706886 U | 1/2011 |
| CN | 101984153 A | 3/2011 |

(Continued)

OTHER PUBLICATIONS

English computer translation of CN 203049085 U (Year: 2021).*

*Primary Examiner* — Matthew J Song
(74) *Attorney, Agent, or Firm* — Alleman Hall Creasman & Tuttle LLP

(57) ABSTRACT

The invention relates to a crucible for crystal growth and a method for releasing thermal stress of silicon carbide crystals. The crucible is a crucible in contact with the side surface of the prepared crystals, and the crucible has an annular non-closed splicing structure. The crucible for the crystal growth has the annular non-closed splicing structure, so that the crystals can be prevented from being hooped, hot stress concentrated in the crystals in the growth process of the crystals can be effectively released, the fracturing rate of the crystals can be reduced, and the finished product rate of the crystals can be increased.

6 Claims, 3 Drawing Sheets

(56) References Cited

U.S. PATENT DOCUMENTS

| | | | |
|---|---|---|---|
| 2012/0037065 A1* | 2/2012 | Wagner | C30B 11/002 117/13 |
| 2014/0234194 A1* | 8/2014 | Zwieback | C30B 29/36 423/275 |
| 2016/0083865 A1 | 3/2016 | Sakurada et al. | |

FOREIGN PATENT DOCUMENTS

| | | | | |
|---|---|---|---|---|
| CN | 202688507 U | | 1/2013 | |
| CN | 103205803 A | | 7/2013 | |
| CN | 203049085 U | * | 7/2013 | C30B 15/10 |
| CN | 104073878 A | | 10/2014 | |
| CN | 204039545 U | | 12/2014 | |
| CN | 105463574 A | | 4/2016 | |
| CN | 205241854 U | | 5/2016 | |
| CN | 205774932 U | | 12/2016 | |
| JP | 06122968 A | * | 5/1994 | C23C 14/24 |
| JP | 3371120 B2 | | 1/2003 | |

\* cited by examiner

CRUCIBLE FOR CRYSTAL GROWTH AS WELL AS METHOD FOR RELEASING THERMAL STRESS IN SILICON CARBIDE CRYSTAL

TECHNICAL FIELD

The present application belongs to the field of crystal growth and the field of silicon carbide materials, and specially relates to a crucible for crystal growth and a method for releasing thermal stress of silicon carbide crystals in the growth process of silicon carbide crystals by physical vapor transport method.

BACKGROUND

Silicon carbide (SiC) single crystal materials, which have a wide band-gap, high thermal conductivity, high electron saturation migration rate, high breakdown electric field, etc., and thus, have obvious superiority compared with first generation semiconductor materials and second generation semiconductor materials, are regarded as an ideal semiconductor material for manufacturing optoelectronic devices, high-frequency and high-power devices and power electronic devices, and are widely used in white light lighting, optical storage, screen display, aerospace, high-temperature radiation environment, oil exploration, automation, radar and communication, automobile electronization, and so on.

At present, the most effective method of growing SiC crystals is physical vapor transport (PVT) method. The entire growth chamber is mainly composed of three parts: a silicon carbide raw material zone, a crystal growth zone, and a seed crystal zone. The main problem in preparing the SiC crystals by PVT method is that it is easy to form defects and stress concentration zones. Especially when the size of the SiC crystals reaches 4 inches or more as required, even a tiny thermal stress tends to easily cause crystal cracking, which greatly affects the finished product rate of the crystals. Therefore, how to reduce the thermal stress formed during the growth process of silicon carbide crystals is very important for the preparation of the silicon carbide crystal finished products. In Chinese and foreign patents (US 20160083865 A1, CN 200910243520.4, CN 201510994404.1) the thermal stress of the crystals is usually reduced by annealing in the furnace or secondary annealing after the crystals have been taken out; however, an annular closed graphite crucible in the growth zone is in close contact with the side surface of the crystals during the growth process of the crystals, and the internal thermal stress caused by the difference of thermal expansion coefficients therebetween during the growth process of the crystals cannot be released effectively, leading to easy cracking of the crystals once the crystals are taken out from the furnace. All graphite crucibles used in PVT method to grow the silicon carbide crystals are made of graphite with high strength, high density, and high purity, which is relatively expensive. In the patents (CN201521114037.3, CN 201706886 U, CN 202688507 U), graphite crucibles with upper-lower splicing structure were employed to achieve the reuse of some structural components, thus reducing costs, but graphite components in the growth zone of the crucibles have annular closed structures, and thermal stress concentrated in the silicon carbide crystals during the growth process of the crystals cannot be effectively released.

SUMMARY

In view of the problem that crystals are hooped by the inner wall of the crucible in the growth zone during SiC crystal growth process through a PVT method, as a result of which the thermal stress concentrated cannot be effectively released, and thus, affects the finished product rate, a crucible component with an annular non-closed structure is designed in the present application for the first time, which is applied to the area that is in direct contact with a side surface of the silicon carbide crystals in the crystal growth zone, not only ensuring that thermal stress concentrated in the silicon carbide crystals during crystal growth is effectively released, and thus, improve the finished product rate, but also realizing the replacement of fewer parts of crucible components to further reduce costs for preparing the crystals.

In one aspect, the present application provides a crucible for crystal growth, wherein the crucible is a crucible in contact with a side surface of a crystal as prepared, and the crucible has an annular non-closed splicing structure.

The crucible for crystal growth has an annular non-closed splicing structure, so that the crystal can be prevented from being hooped, thermal stress concentrated in the crystal during the growth process of the crystal can be effectively released, the fracturing rate of the crystal can be reduced, and the finished product rate of the crystal can be increased.

Preferably, the crucible is a graphite crucible, a silicon carbide crucible, or a titanium carbide crucible.

Preferably, the thickness of splicing parts of the crucible in direct contact with the side surface of the crystal as prepared is 1 mm or more, preferably 1 to 10 mm.

Preferably, the crucible has a single-layer structure, and splicing parts thereof form a concave-convex engagement type splicing structure.

Preferably, the crucible has a multi-layer nested structure, wherein at least the innermost layer has an annular non-closed splicing structure, and the annular non-closed splicing structure is a direct joint type splicing structure and/or a concave-convex engagement type splicing structure.

Preferably, a gap or tolerance of a splicing area is controlled within 3 mm, preferably 0.1 to 1 mm.

In another aspect, the present application provides a method for releasing thermal stress of a silicon carbide crystal, wherein a silicon carbide single crystal is deposited and grown on a surface of a seed crystal by a physical vapor transport method, and a crucible in contact with a side surface of the crystal as prepared in a growth zone chamber is any one of the above-mentioned crucibles for crystal growth.

In the present invention, the crucible for crystal growth has an annular non-closed splicing structure, so that the crystal can be prevented from being hooped, thermal stress concentrated in the crystal during the growth process of the crystal can be effectively released, the fracturing rate of the crystal can be reduced, and the finished product rate of the crystal can be increased.

Preferably, in the physical vapor transport method, a crystal growing furnace is depressurized to a vacuum degree of $1.0 \times 10^{-2}$ Pa or lower, and filled with an inert atmosphere until the growth pressure reaches 6 to 40 Torr, and the growth temperature is 2,000 to 2,400° C.

According to the present application, thermal stress concentrated in the crystal during the growth process of the crystal can be effectively released, the fracturing rate of the crystal can be reduced, and the finished product rate of the crystal can be increased.

Figure 2A:
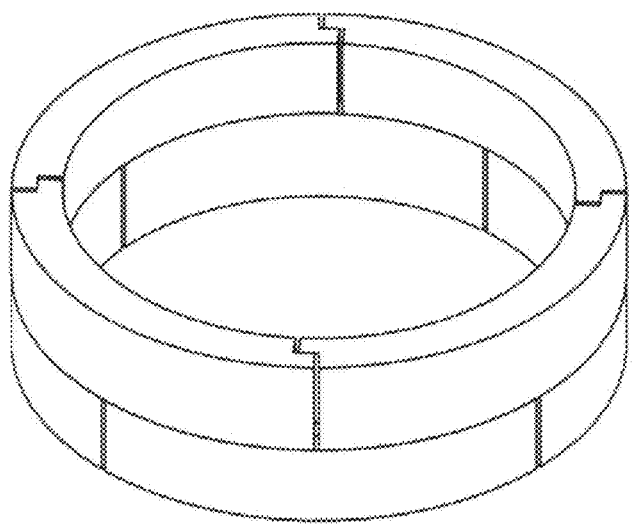
Figure 2B:
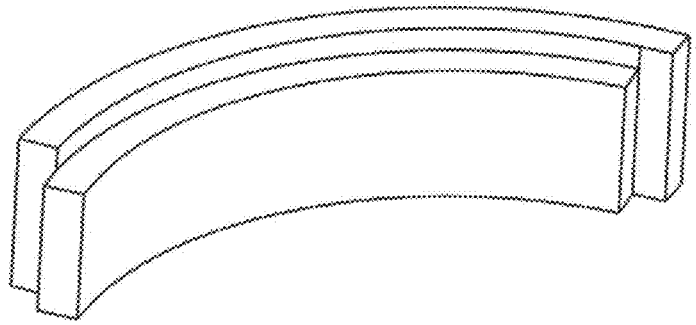
Figure 3:
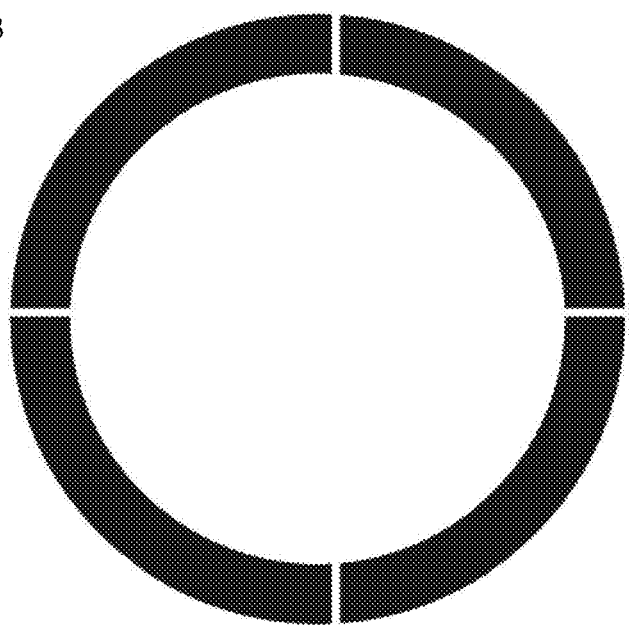
Figure 4A:
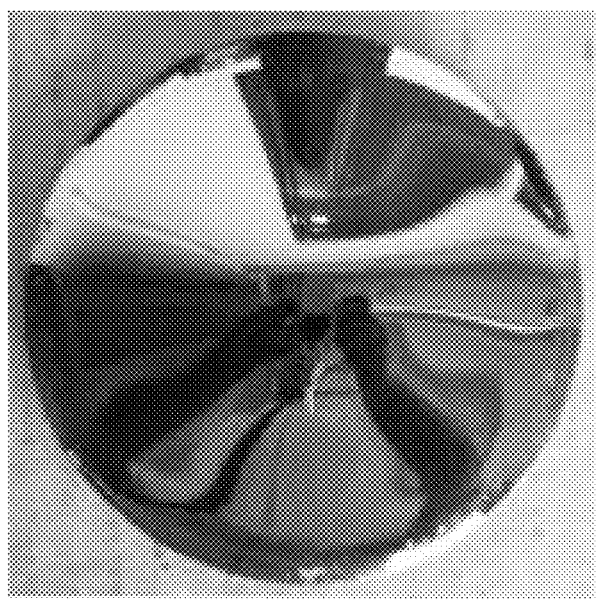
Figure 4B:
Figure 4C:
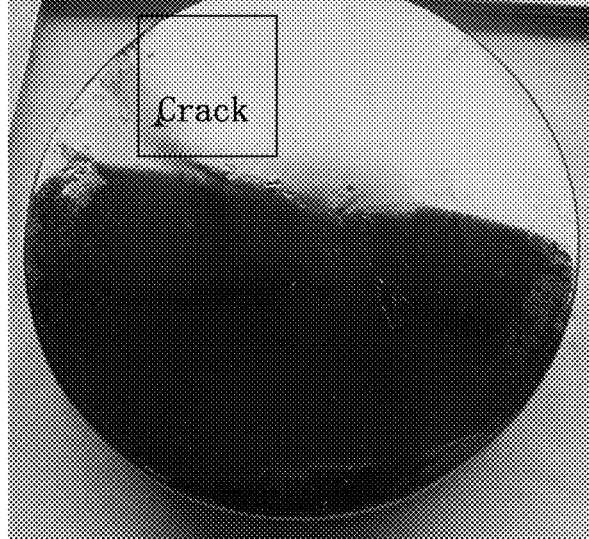

method, wherein the list of components represented by each reference number is as follows: 1 is a crucible component of a chamber in a growth zone, and the dotted line indicates that the crucible component can be a multi-layer or single-layer structure; 2 is a crucible component in a raw material zone; 3 is a cap component in a seed crystal zone for adhering a seed crystal; 4 is a SiC raw material; 5 is a SiC seed crystal; and 6 is a grown crystal;

FIG. 2(1) FIG. 2A is a schematic diagram of a crucible component as the inner wall of a growth chamber which has an annular non-closed transversal-longitudinal splicing structure for preparing the SiC crystals by a PVT method;

FIG. 2B is a schematic diagram of a single splicing part of the crucible component in FIG. 2A;

FIG. 3 is a top view of a graphite crucible component in a growth zone, which has a longitudinal direct joint type splicing structure; and FIGS. 4A-4C are photos of crystals prepared in the examples and in the comparative examples, wherein FIG. 4A is a crack-free crystal prepared in example 1; FIG. 4B is a crack-free crystal prepared in example 2; and FIG. 4C is a cracked crystal prepared in comparative example 1.

DETAILED DESCRIPTION

The present invention will be further described with the following embodiments below. It should be understood that the following embodiments are only used for explaining this invention, and do not limit this invention.

Figure 1:
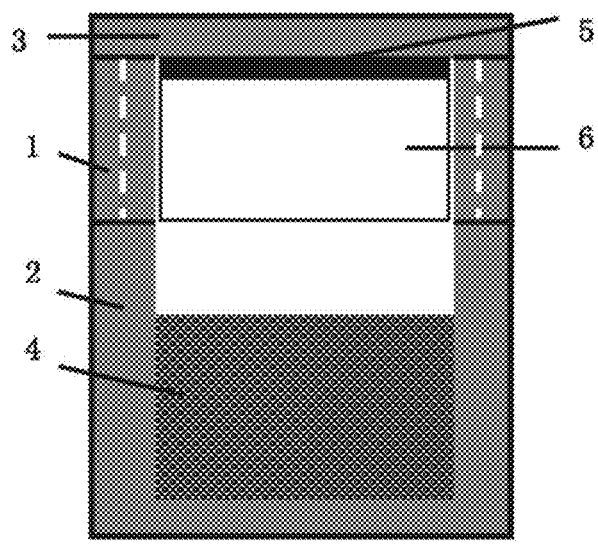
FIG. 1 is a schematic diagram of a growth chamber for growing SiC crystals by a physical vapor transport (PVT)

FIG. 1 shows a schematic diagram of a growth chamber for growing SiC crystals by a physical vapor transport (PVT) method. As shown in FIG. 1, the structure of the growth chamber is mainly composed of three parts: a silicon carbide raw material zone, a crystal growth zone, and a seed crystal zone. Specifically, the structure of the growth chamber includes: a crucible component 2 in the raw material zone, which is a high-temperature zone and is used for holding a raw material 4 (such as a SiC raw material) for growing crystals; a crucible component 1 of a chamber in the growth zone located above the crucible component 2 in the raw material zone; and a cap component 3 covering the crucible component 2 in the raw material zone, to the raw material-facing side of which a seed crystal 5 is adhered. The raw material 4 for growing crystals evaporates under a high temperature, spontaneously travels to the surface of the seed crystal 5 with a relatively low temperature driven by the temperature gradient in the crucible, and forms a crystal 6 in the crucible component 1 of the chamber in the growth zone due to supersaturated condensation and crystallization. In an example of growing silicon carbide crystals by a PVT method, the growth chamber is depressurized to a vacuum degree of $1.0 \times 10^{-2}$ Pa or lower, and then filled with an inert gas (such as argon, etc.) to a growth pressure of 6 to 40 Torr, and a silicon carbide single crystal is deposited and grown on the surface of the seed crystal at a growth temperature of 2,000 to 2,400° C. After growth, the silicon carbide crystal is cooled and taken out.

The crucible component 1 of a chamber in a growth zone (also referred to as "crucible for crystal growth") is a crucible in contact with the side surface of a crystal as prepared. In an example of the present application, the crucible component 1 of a chamber in a growth zone has an annular non-closed splicing structure.

"Annular non-closed splicing structure" refers to a cylindrical structure formed by the splicing of multiple splicing parts in the circumferential direction. The annular non-closed splicing structure is movable under a force from a crystal, and thus, will not hoop the crystal tightly. Accordingly, the thermal stress concentrated in the crystal in the growth process thereof can be effectively released, the fracturing rate of the crystal can be reduced, and the finished product rate of the crystal can be increased.

In addition, it should be understood that, "a crucible component 1 of a chamber in a growth zone has an annular non-closed splicing structure" means at least part of the crucible component 1 of a chamber in a growth zone is an annular non-closed splicing structure. More specifically, at least the side surface (usually an inner wall) of the crucible component 1 of a chamber in a growth zone which is in direct contact with the crystal as prepared has an annular non-closed splicing structure.

At the same time, it should be understood that the crucible component 1 of a chamber in a growth zone integrally forms a structure that can prevent gas-phase components from escaping from the side surface.

The crucible component 1 of a chamber in a growth zone may be of a longitudinally separated type, an inner and outer nested type, or a combination of transversal-type and longitudinal-type.

The crucible component 1 of a chamber in a growth zone may adopt a longitudinal splicing (as shown in FIG. 3), a combination of transversal splicing and longitudinal splicing (as shown in FIG. 2A), or both.

The crucible component 1 of a chamber in a growth zone may be a single-layer structure, or a multi-layer (two-layers or more) nested structure.

When the crucible component 1 of a chamber in a growth zone is a single-layer structure, it integrally forms an annular non-closed splicing structure, and the splicing parts thereof are spliced with each other by concave-convex engagement (for example, as shown in FIG. 1). This can prevent gas-phase components from escaping from the side surface.

When the crucible component 1 of a chamber in a growth zone is a multi-layer nested structure, at least the innermost layer thereof has an annular non-closed splicing structure. The splicing parts of the innermost layer with an annular non-closed splicing structure may adopt a direct joint type splicing structure, a concave-convex engagement type splicing structure, or a combination of them. The direct joint type splicing means that the joint surface is a flat plane (for example, as shown in FIG. 3).

The other layers than the innermost layer may be an annular non-closed splicing structure or an annular closed splicing structure. When the other layers are also annular non-closed splicing structures, the splicing parts thereof can form a direct joint type splicing structure, a concave-convex engagement type splicing structure, or a combination of them. When the splicing manner of the other layers includes direct joint type splicing, it should be ensured that the crucible component 1 of a chamber in a growth zone can integrally prevent gas-phase components from escaping from the side surface. For example, the joint surface between each splicing part of the other layers and the joint surface between each splicing part of the innermost layer may not be continuous in the radial direction.

In the annular non-closed splicing structure, the number of splicing parts may be two or more, preferably 3 to 8.

An annular non-closed splicing component in direct contact with the side surface of a crystal as prepared has a thickness of 1 mm or more, preferably 1 to 10 mm, so as to avoid the graphite crucible from being damaged by the corrosion of gas-phase components and reduce the extrusion stress applied by the graphite crucible to the side surface of crystals as much as possible.

The gap or tolerance of a splicing area between each splicing part of the crucible component 1 of a chamber in a growth zone can be controlled within 2 mm, preferably 0.1 to 1 mm, so as to avoid the escape of gas-phase components from the splicing gap between components.

The upper and lower ends of the crucible component 1 of a chamber in a growth zone may have an opening. In addition to an annular non-closed splicing structure, the crucible component 1 of a chamber in a growth zone can also have an upper-lower splicing structure, etc.

The material of the crucible component 1 of a chamber in a growth zone may be graphite, or may be silicon carbide, titanium carbide, etc.

The material of the crucible component 2 in a raw material zone or the cap component may be graphite, or may be silicon carbide, titanium carbide, etc.

The exterior of the growth chamber structure can be surrounded by a thermal insulation felt, such as a thermal insulation carbon felt.

Compared with the crystals hooped tightly by a traditional annular closed crucible component when prepared, the present application, which adopts an annular non-closed splicing component as the inner wall of the chamber of the crystal growth zone, can make thermal stress generated in the growth process of the crystals be effectively released, greatly reduce the fracturing rate of the crystals, improve the finished product rate of grown crystals, and meanwhile realize the replacement of parts of splicing components, further reducing costs for preparing crystals.

The crucible for crystal growth of the present application is applied to silicon carbide crystal growth by a PVT method as an example. However, it should be understood that the crucible for crystal growth in the present application is not limited to this, but also applicable to the growth of other crystals, as long as the thermal stress needs to be released in the growth process of the crystals.

Hereinafter, the present invention will be better described with the following representative examples. It should be understood that the following examples are used to explain this invention and do not limit the scope of this invention. Any non-essential improvements and modifications made by a person skilled in the art can choose proper values within an appropriate range according to the description of this article, and are not restricted to the specific values cited below.

Example 1

As shown in FIG. 1, first, a graphite crucible having a graphite cap with a seed crystal adhered thereto at the top and a raw material zone filled with silicon carbide raw materials at the bottom was placed in a thermal insulation carbon felt, and then put into a crystal growth furnace, wherein the graphite crucible component of a chamber in a growth zone adopts an inner and outer nested crucible structure with two layers. The component of the inner layer of the chamber in contact with grown crystals adopts a longitudinal direct joint type splicing structure, in which, as shown in FIG. 3, four small pieces are spliced and assembled to form an annular non-closed crucible inner wall, and the outer layer adopts a traditional annular side-closed crucible structure. The vacuum degree was reduced to $1.0 \times 10^{-2}$ Pa or lower, and then an argon atmosphere was filled and the temperature was raised, to reach a condition that the growth pressure was 10 Torr and the growth temperature was 2,080° C., under which condition a crystal was grown. After 120 hours of growth, the furnace was cooled to room temperature according to a program and opened, to obtain a crack-free silicon carbide single crystal (FIG. 4A). The side surface of the crystal is smooth and ablative-like, which indicates that the thermal stress in the crystal is effectively released. In addition, undamaged splicing parts can be reused, which further reduces the cost of crystal preparation.

Example 2

As shown in FIG. 1, first, a graphite crucible having a graphite cap with a seed crystal adhered thereto at the top and a raw material zone filled with silicon carbide raw materials at the bottom was placed in a thermal insulation carbon felt, and then put into a crystal growth furnace, wherein the graphite crucible component of a chamber in a growth zone adopts a single-layer crucible structure, which has a transversal concave-convex engagement type splicing structure, in order to prevent the escape of gas-phase components from the side surface of the crucible. As shown in FIG. 2A, a number of small pieces (as shown in FIG. 2B) were spliced and assembled to form an annular non-closed crucible component. The vacuum degree was reduced to $1.0 \times 10^{-2}$ Pa or lower, and then an argon atmosphere was filled and the temperature was raised, to reach a condition that the growth pressure was 20 Torr and the growth temperature was 2,150° C., under which condition a crystal was grown. After 100 hours of growth, the furnace was cooled to room temperature according to a program and opened, to obtain a crack-free silicon carbide single crystal (FIG. 4B). The side surface of the crystal is smooth and ablative-like, which indicates that the thermal stress in the crystal is effectively released. In addition, undamaged splicing parts can be reused, which further reduces the cost of crystal preparation.

Comparative Example 1

The only difference between comparative example 1 and example 1 is that the graphite crucible component of a chamber in a growth zone adopts an annular closed crucible component, which is a non-splicing crucible component. Specifically, as shown in FIG. 1, first, a graphite crucible having a graphite cap with a seed crystal adhered thereto at the top and a raw material zone filled with silicon carbide raw materials at the bottom was placed in a thermal insulation carbon felt, wherein the graphite crucible component of a chamber in a growth zone adopts an annular closed crucible component, and then was placed in a crystal growth chamber. The vacuum degree was reduced to $1.0 \times 10^{-2}$ Pa or lower, and then an argon atmosphere was filled and the temperature was raised, to reach a condition that the growth pressure was 10 Torr and the growth temperature was 2,080° C., under which condition a crystal was grown. After 120 hours of growth, the furnace was cooled to room temperature according to a program and opened. It was observed that the crucible component in contact with the crystal tightly hooped the silicon carbide crystal. After sawing the crucible component, cracks were found on the surface of the crystal (FIG. 4C), and the side surface of the crystal was relatively rough, indicating that the thermal stress in the crystal was not completely released.

It should be pointed out that the specific embodiments mentioned above are only a detailed description of the present invention, and not intend to limit the present invention. For a person skilled in the art, there can be a variety of variations in form and detail without departing from the spirit and scope of the claims.

The invention claimed is:

1. A method for releasing thermal stress of a silicon carbide crystal during growth of the silicon carbide crystal, comprising:
   depositing and growing a silicon carbide single crystal on a surface of a seed crystal by a physical vapor transport method;
   contacting a side surface of the silicon carbide crystal during the growth in a growth zone chamber with a crucible having an annular non-closed splicing structure comprising splicing parts so that the crystal is prevented from being hooped and thermal stress concentrated in the crystal during the growth of the crystal is released; and
   controlling a gap or tolerance of a splicing area between the splicing parts to be 1 to 3 mm.

2. The method of claim 1, wherein in the physical vapor transport method, a crystal growing furnace is depressurized to a vacuum degree of $1.0 \times 10^{-2}$ Pa or lower, and filled with an inert atmosphere until the growth pressure reaches 6 to 40 Torr, and the growth temperature is 2,000 to 2,400° C.

3. The method of claim 1, wherein the thickness of the splicing parts of the crucible in direct contact with the side surface of the crystal during the growth is 1 to 10 mm.

4. The method of claim 1, wherein the crucible is a graphite crucible, a silicon carbide crucible, or a titanium carbide crucible.

5. The method of claim 1, wherein the crucible has a single-layer structure, and the splicing parts form a concave-convex engagement type splicing structure.

6. The method of claim 1, wherein the crucible has a multi-layer nested structure, wherein at least the innermost layer has the annular non-closed splicing structure, and the annular non-closed splicing structure is at least one of a direct joint type splicing structure and a concave-convex engagement type splicing structure.

* * * * *